United States Patent [19]

Quigley et al.

[11] Patent Number: 5,708,288
[45] Date of Patent: Jan. 13, 1998

[54] THIN FILM SILICON ON INSULATOR SEMICONDUCTOR INTEGRATED CIRCUIT WITH ELECTROSTATIC DAMAGE PROTECTION AND METHOD

[75] Inventors: John H. Quigley, Phoenix, Ariz.; Jeremy C. Smith, Austin, Tex.; Percy Gilbert, Austin, Tex.; Shih Wei Sun, Austin, Tex.

[73] Assignee: Motorola, Inc., Schaumburg, Ill.

[21] Appl. No.: 556,891

[22] Filed: Nov. 2, 1995

[51] Int. Cl.$^6$ .................................. H01L 23/62
[52] U.S. Cl. .................... 257/355; 257/347; 257/350; 437/6
[58] Field of Search .......................... 257/328, 355, 257/363, 347, 350; 437/6

[56] References Cited

U.S. PATENT DOCUMENTS

| | | | |
|---|---|---|---|
| 4,423,431 | 12/1983 | Sasaki | 361/56 |
| 4,989,057 | 1/1991 | Lu | 357/237 |
| 5,172,208 | 12/1992 | Malhi | 437/6 |
| 5,240,865 | 8/1993 | Malhi | 437/6 |
| 5,369,041 | 11/1994 | Duvvury | 437/6 |
| 5,399,507 | 3/1995 | Sun | 437/24 |
| 5,440,153 | 8/1995 | Male et al. | 257/204 |
| 5,502,317 | 3/1996 | Duvvury | 257/360 |

*Primary Examiner*—Mark V. Prenty
*Attorney, Agent, or Firm*—Rennie William Dover; Harry A. Wolin

[57] ABSTRACT

A thin film silicon on insulator circuit with a low voltage triggered, surface silicon controlled rectifier (30) for electrostatic damage protection and method is provided. A surface silicon controller rectifier (30) is formed in a thin device layer (130), overlying a buried insulation layer (110) and electrically coupled to a low voltage trigger apparatus (36). In one embodiment, a zener diode is employed as the low voltage trigger apparatus (36), and in another embodiment low voltage trigger apparatus (36) is an n-channel MOSFET.

20 Claims, 4 Drawing Sheets

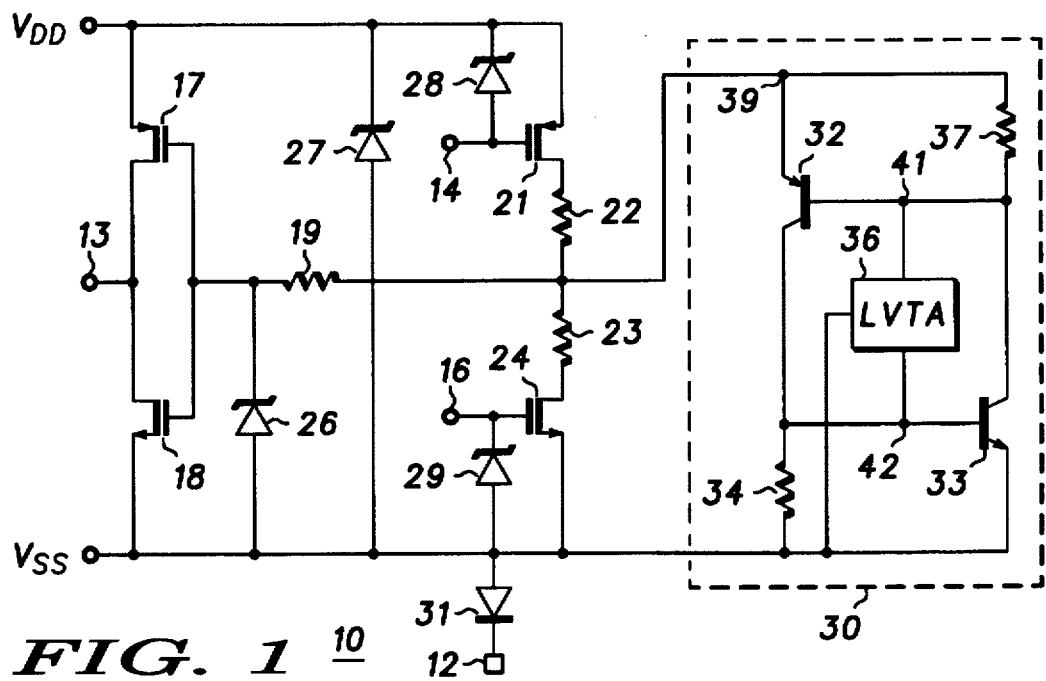
FIG. 1 10
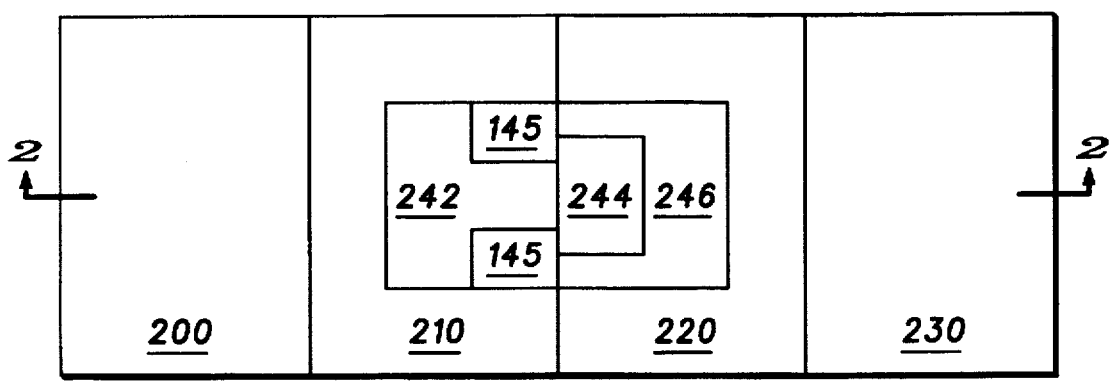
30 FIG. 2
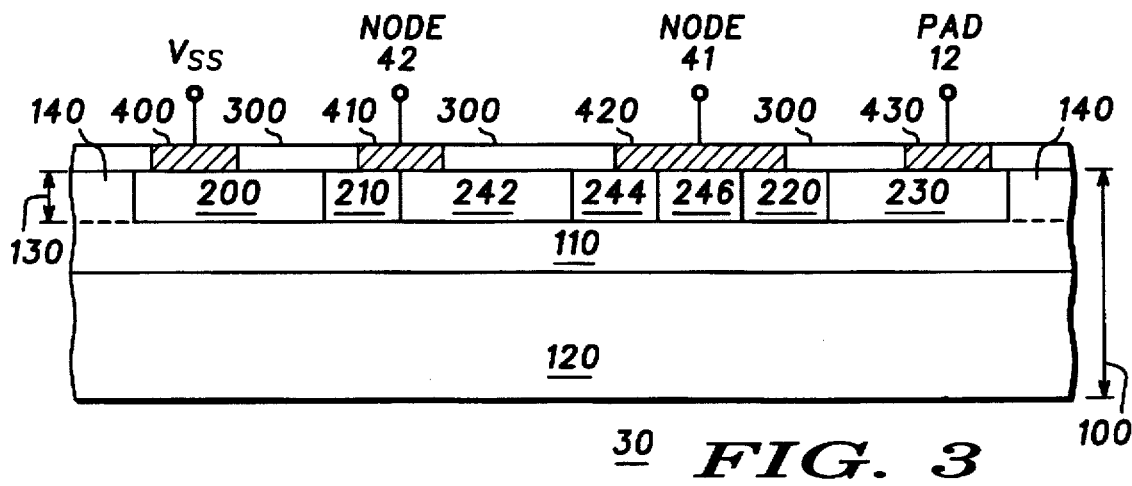
30 FIG. 3

THIN FILM SILICON ON INSULATOR SEMICONDUCTOR INTEGRATED CIRCUIT WITH ELECTROSTATIC DAMAGE PROTECTION AND METHOD

CROSS-REFERENCE TO RELATED APPLICATIONS

The present application is related to copending U.S. patent application Ser. No. 08/384,047, entitled "INPUT/OUTPUT ELECTROSTATIC DISCHARGE PROTECTION CIRCUIT FOR AN INTEGRATED CIRCUIT" filed on Feb. 6, 1995, by John H. Quigley et al. and also assigned to the same assignee, Motorola, Inc.

BACKGROUND OF THE INVENTION

This invention relates, in general, to high voltage protection for an integrated circuit (IC) semiconductor device, and more particularly, to low voltage triggered electrostatic discharge (ESD) protection for a thin film silicon on insulator (TFSOI) semiconductor integrated circuit device.

Electrostatic discharge is a common problem in the handling of any IC semiconductor device. An ESD event can subject the IC to thousands of volts, typically through its input/output (I/O) circuitry. As an ESD event is indiscriminate in its entry, it is typical to incorporate ESD protection circuitry in each I/O circuit of the IC.

Recently, TFSOI ICs have shown great promise for high performance in low voltage applications. Their performance advantages over bulk silicon devices arise from the very shallow device junctions inherent in a TFSOI IC. However, due to these shallow junctions, TFSOI ICs present special problems for the design and implementation of ESD protection that are not found in bulk devices. The shallow device junctions do not provide as much silicon volume as bulk devices to dissipate the energy associated with an ESD event. In addition, while many protection schemes for bulk MOS technologies can rely on bipolar transistors formed with available process steps in the bulk substrate, no such devices are possible in a TFSOI structure. Finally, while it has been shown that semiconductor rectifier structures (SCR) are very efficient devices for ESD protection, the type of SCR that can be formed with bulk semiconductor technologies is not possible in TFSOI due to the absence of a well region.

Currently ESD protection techniques for TFSOI fall into two major categories. The first type of protection utilizes the available thin film junctions, while the second type removes a portion of the insulator layer and places classical protection devices in the non-insulated region of the bulk wafer. An example of this second approach is seen in U.S. Pat. No. 5,399,507 "FABRICATION OF MIXED THIN-FILM AND BULK SEMICONDUCTOR SUBSTRATE FOR INTEGRATED CIRCUIT APPLICATIONS" issued Mar. 21, 1995 to Shih-Wei Sun, and assigned to Motorola, Inc. U.S. Pat. No. 5,399,507 is hereby incorporated by reference. While this second approach eliminates the problems associated with the very shallow device junctions of TFSOI circuits, it requires several additional process steps that add to manufacturing costs.

With regard to the first approach, several recently reported ESD protection schemes for TFSOI devices rely on the parasitic NPN transistor found under a large NMOS device. These schemes have layout specific techniques to uniformly trigger the protection devices while assuring the current is spread evenly throughout the protection structure. The level of ESD protection has been observed to vary depending on how these devices have been implemented. In addition, thermal analysis has shown that NPN structures implemented in TFSOI will need to be extremely large to adequately protect the integrated circuit. However, in standard CMOS ESD protection circuits, it has been seen that large structures are typically inefficient and often fail to evenly distribute current. In addition, the parasitic capacitance created by such large structures adversely impacts the circuit's speed, thus degrading overall device performance.

As the manufacturing costs of an ESD protection scheme that utilizes existing thin film junctions is lower than that of a mixed scheme, it would be a great benefit to provide such a scheme that does not impact overall circuit performance.

Thus it is an objective of the present invention to provide an ESD protection scheme that utilizes the thin film junctions of the TFSOI device while not impacting overall device performance.

It is another objective of the present invention to employ a more efficient device than a parasitic NPN transistor, such as a TFSOI SCR device or surface silicon controlled rectifier (SSCR).

It is still a further objective of the present invention to utilize a SSCR, within the I/O circuitry, having a low voltage triggering mechanism. Whereas, the triggering mechanism is also self-triggering to insure coupling of the SSCR before any damage is done to the plurality of integrated circuit elements that it protects.

It is yet another objective of the present invention to provide a low voltage triggering apparatus for the SSCR that turns on above a predictable trigger current and turns off when the current falls below the predictable trigger current.

Finally, it is an objective of the present invention to provide a low voltage triggered SSCR as ESD protection with little or no impact on the manufacturing costs of the TFSOI IC by utilizing existing process steps, where possible, for forming the necessary device structures.

BRIEF DESCRIPTION OF THE DRAWINGS

FIG. 1 is a schismatic diagram of an I/O portion of an integrated circuit including ESD protection circuitry in accordance with the present invention;

FIG. 2 is a simplified, plan view of a structure with an internal triggering device that incorporates an embodiment of the present invention;

FIG. 3 through FIG. 7 are simplified cross sectional views, taken through sectional line 2—2 of FIG. 2, of a portion of an IC during fabrication depicting various process steps in the fabrication;

DETAILED DESCRIPTION OF THE DRAWINGS

Figure 4:
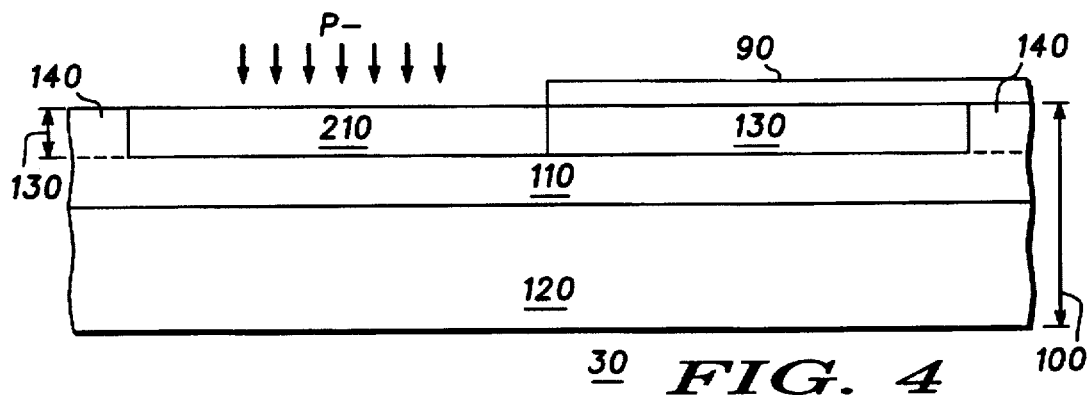

FIG. 1 is a schematic diagram of an I/O circuit 10 of a thin film silicon on insulator semiconductor integrated circuit including novel electrostatic discharge (ESD) protection circuitry. The ESD protection circuitry of I/O circuit 10 comprises transistors 32 and 33, low voltage triggering apparatus (LVTA) 36, zener diodes 26, 27, 28 and 29, diode 31, and resistors 34 and 37. In a first embodiment of the present invention, LVTA 36 is a zener diode, in a second embodiment, LVTA 36 is an n-channel MOSFET. Transistors 32 and 33 are bipolar transistors each having a collector, base, and emitter respectively corresponding to a first electrode, a control electrode, and a second electrode. Transistor 32 is a PNP transistor and transistor 33 is a NPN transistor.

Transistors 17, 18, 21 and 24 are enhancement Metal Oxide Semiconductor Field Effect Transistors (MOSFETs) each having a drain, gate, and source, respectively corresponding to a first electrode, a control electrode, and a second electrode. Transistors 17 and 21 are p-channel MOSFETs and transistors 18 and 24 are n-channel MOSFETs. Transistors 21 and 24 are typically large power transistors that form an output buffer for driving circuitry external to the integrated circuit. Thus, a signal from the internal circuitry of the integrated circuit is provided to either input 14 or 16 enabling transistor 21 or 24, respectively, to provide an output signal.

Surface silicon controlled rectifier (SSCR) 30 comprises transistors 32, 33, LVTA 36, and distributed resistances 34 and 37. SSCR 30 provides additional ESD protection by virtue of its low impedance, which would short an ESD event when enabled. SSCR 30 is coupled between pad 12 and the power supply line coupled to $V_{SS}$. Transistor 32 has a collector coupled to a node 42, a base coupled to a node 41, and an emitter coupled to node 39. Distributed resistance 34 arises in SSCR 30 between node 42 and $V_{SS}$. Transistor 33 has a collector coupled to node 41, a base coupled to node 42, and an emitter coupled for receiving the power supply voltage $V_{SS}$. LVTA 36 has a first terminal coupled to node 41, and a second terminal coupled to node 42. Distributed resistance 37 arises in the SSCR 30 between node 39 and a second terminal coupled to node 41.

During normal operation of the integrated circuit SSCR 30 is not enabled. However, when LVTA 36 is caused to breakdown by an ESD event, SSCR 30 is enabled. Current conduction through LVTA 36 enables transistors 32 and 33. Positive feedback enables SSCR 30 to change from an open circuit to an extremely low impedance circuit that prevents the ESD event from damaging the I/O circuitry.

In one embodiment, LVTA 36 is a zener diode. Zener diode 36 is designed to have a zener breakdown voltage lower than the breakdown voltage of transistor 24. Thus, SSCR 30 is enabled when an ESD event causes zener diode 36 to enter into zener breakdown. Current conduction through zener diode 36 enables transistors 32 and 33. Positive feedback enables SSCR 30 to change from an open circuit to a circuit having very low impedance, thus preventing the ESD event from damaging the I/O circuitry. Thus SSCR 30 is self-triggering, being enabled at a predictable trigger current while turning off when the current falls below the predictable trigger current.

In another embodiment, LVTA 36 is an n-channel MOSFET formed by the same process steps that are used to form transistor 24 thereby insuring that the characteristics of the two transistors are similar. However, the length of transistor 36 is made to be less than the length of transistor 24 thus insuring that transistor 36 will have a lower breakdown voltage than transistor 24. Thus, low voltage triggered SSCR 30 is enabled when an ESD event causes transistor 36 to breakdown. Current conduction through transistor 36 enables transistors 32 and 33. Positive feedback enables low voltage triggered SSCR 30 to change from an open circuit to a circuit having very low impedance, thus preventing the ESD event from damaging the I/O circuitry. Thus SSCR 30 is self-triggering, being enabled at a predictable trigger current while turning off when the current falls below the predictable trigger current.

Turning now to FIG. 2, a simplified plan view of a structure of an embodiment of the present invention that incorporates a zener diode as low voltage triggering apparatus 36 seen in FIG. 1. SSCR 30 is comprised of an N+ doped region 200, a P− doped region 210, an N− doped region 220 and a P+ doped region 230. In this first structure, all elements of low voltage triggering apparatus or zener diode 36 are formed within the boundaries of surface silicon controlled rectifier 30. Zener diode 36 comprises P+ doped zener region 242, field oxide regions 145, N− doped zener region 244 and N+ doped zener 246. Zener region 242 and oxide regions 145 are formed in P− doped SSCR region 210, and zener regions 244 and 246 are both formed in N− doped region 220.

In FIG. 3, a cross sectional view of the structure of FIG. 2 is shown taken through section line 2—2. Thin film silicon on insulator (TFSOI) substrate 100 is seen to comprise buried insulation layer 110 which overlies semiconductor substrate 120. In addition, thin silicon device layer 130, overlying buried insulation layer 110, is formed into the doped regions and field oxide regions of FIG. 2.

As it is well known, TFSOI substrate 100 can be made using commonly employed methods, such as direct wafer to wafer bonding or oxygen implantation. Silicon device layer of thin film silicon layer 130 is a single crystal silicon layer preferably 80 to 120 nanometers (nm) thick and typically 100 nm thick. Although thin film silicon layer 130 can be made thicker or thinner to accommodate the specific device functions of the IC being fabricated, SOI substrates designated as TFSOI typically have a device layer 130 less than 200 nm thick. Buried insulation layer 110 is preferably 100 to 400 nm thick and typically 200 nm thick and is tailored to insure electrical isolation of device layer 130 from substrate 120. Field oxide regions 140 are formed concurrently with field oxide regions 145 seen in FIG. 2. However, as section line 2—2 does not pass through oxide regions 145, regions 145 are not seen in this cross sectional view. A standard oxidation process, such as Local Oxidation Of Silicon (LOCOS), poly buffered LOCOS (PBL) or other similar processes well known in the art, is used to create field oxide regions 140 and 145.

FIG. 3 illustrates the electrical coupling of the various doped regions of SSCR 30. Silicide region 400 contacts doped region 200, silicide region 410 couples doped region 210 to doped zener region 242, silicide region 420 couples doped zener regions 244 and 246 to doped SSCR region 220 and silicide region 430 contacts SSCR region 230. All silicide regions are formed concurrently by depositing a layer of silicon nitride 300 over the surface of at least the doped SSCR regions 200, 210, 220 and 230, and doped zener regions 242, 244 and 246. The nitride layer 300 is then patterned and etched using standard photolithographic techniques. A layer of a refractory metal, such as titanium, is then deposited, by conventional methods, to overlie the various doped regions and patterned silicon nitride layer 300. The deposition step is followed by a thermal heating step to allow the formation of refractory metal silicide regions 400, 410, 420 and 430 in those regions where refractory metal contacts silicon. In those areas where refractory metal overlies patterned silicon nitride 300, no silicide is formed. After a metal etch step the resulting structure of silicide regions 400, 410, 420 and 430 with interposed regions of nitride layer 300 is formed.

Silicide regions 400, 410, 420 and 430 serve to electrically couple or contact both doped zener regions and doped SSCR regions. In addition, silicide regions 400, 410, 420 and 430 serve as low resistance contacts to enable a first metallization (not shown) to electrically couple the low voltage triggered SSCR 30 into I/O circuit 10 (see FIG. 1). Referring again to FIG. 3, silicide region 400 is shown electrically coupled to $V_{SS}$, region 410 to node 42, region 420 to node 41 and silicide region 430 to pad 12.

In FIGS. 4 to 7, the formation of the various doped regions is shown. FIG. 4 illustrates an early step in the formation process where device layer 130 is partially masked by photoresist layer 90. For ease of manufacture, P− SSCR region 210 is formed directly over and abutting buried insulation layer 110, using the Lightly Doped Drain (LDD) implant step concurrent with the formation of p-type LDD source and drain regions in the balance of the circuit. Typically, this implant employs boron implanted with a dose in the range of approximately 5E13 to 1E14 atoms per centimeter squared ($cm^2$).

Figure 5:
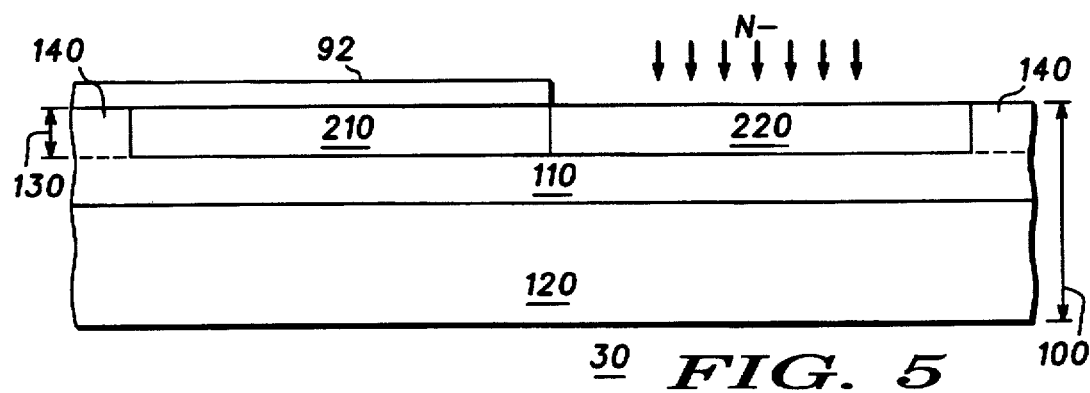

FIG. 5 shows the formation of N− SSCR region 220. Device layer 130 is partially masked by photoresist layer 92 and is seen to expose the unexposed region of FIG. 4. An implant of n-type dopant, typically phosphorus or arsenic, is performed with a dose in the range of approximately 5E13 to 2E14 atoms per $cm^2$ of the selected impurity to form region 220 abutting insulation layer 110. This implant step is performed concurrently with forming n-type LDD source and drain regions in the balance of the circuit.

Figure 6:
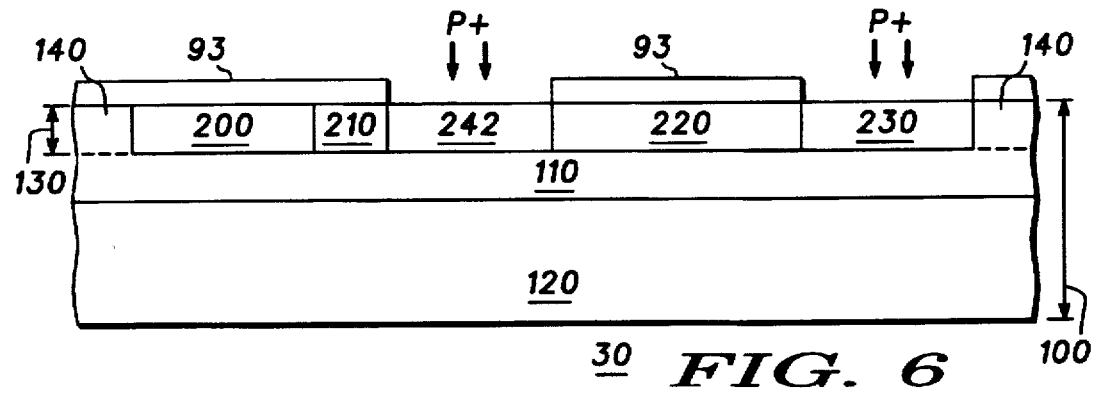

Turning now to FIG. 6, silicon device layer 130 is partially masked by photoresist layer 93, exposing P+ zener region 242 and P+ SSCR region 230. It can be seen that P+ region 230 is to be formed within N− region 220. As is known in the art, the impurity type of a region can be changed by implantation of a second type of impurity when the dose level of the second impurity is above that of the first. Thus, a p-type implant is performed with a dose in the range of approximately 3E15 to 8E15 atoms per $cm^2$ to form regions 230 and 242 abutting buried insulation layer 110.

Figure 7:
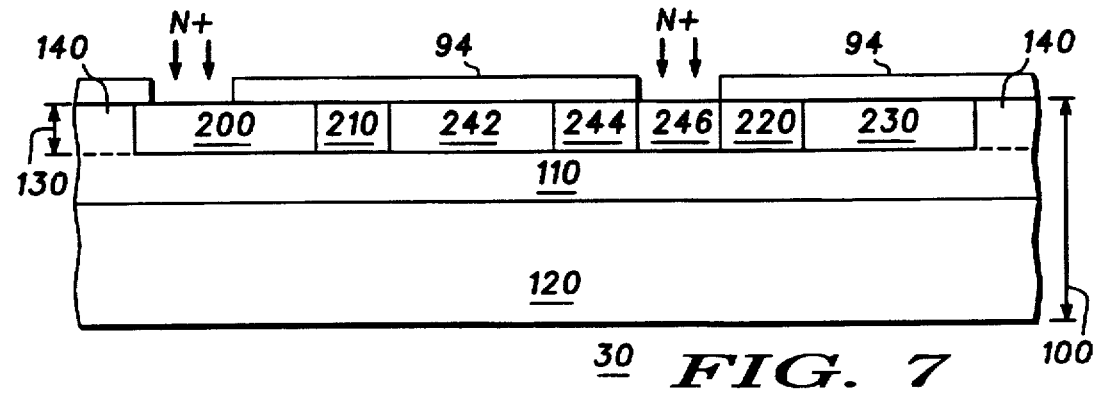

FIG. 7 illustrates the formation of N+ SSCR region 200 and N+ zener region 246. Device layer 130 is seen partially masked by photoresist layer 94. An n-type implant is performed with a dose in the range of approximately 3E15 to 8E15 atoms per $cm^2$ to form regions 200 and 246 abutting insulation layer 110. Thus all of the SSCR and zener doped regions are formed using four masked implant steps. However, as N− and P− regions are formed concurrently with corresponding LDD regions in other circuit elements, only two additional masked implant steps are required. As seen in FIG. 7, each doped region is adjacent to at least one other doped region and all are directly over and abut to buried insulation layer 110. It can be seen that SSCR region 200 is adjacent SSCR region 210, which is also adjacent zener region 242. Adjacent to zener region 242 is zener region 244, which is also adjacent zener region 246. Zener region 246 is adjacent SSCR region 220 which is also adjacent SSCR region 230.

Figure 8:
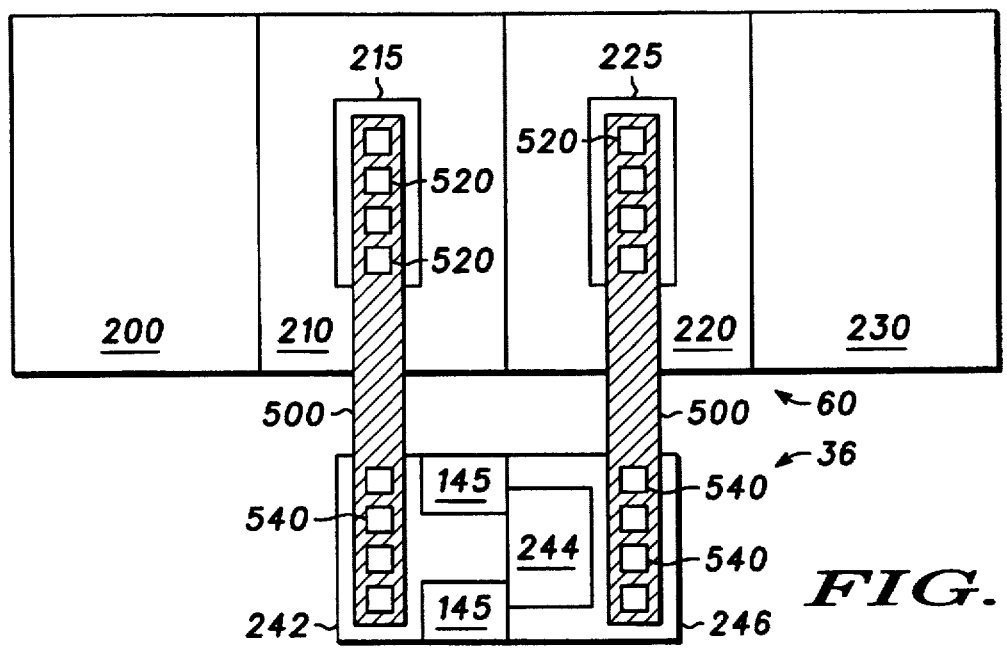
FIG. 8 is a simplified, plan view of a structure with an external triggering device that incorporates an embodiment of the present invention.

FIG. 8 depicts another structure in accordance with the present embodiment. Zener diode 36 is shown formed outside the boundaries of the doped regions that make up SSCR 60. Diode 36 is electrically coupled to SSCR 60 by electrical couplings 500 formed from a first metallization. Contact enhancement regions 215 and 225 are formed in first P− doped region 210 and second N− doped region 220, respectively, to enhance electrical contact to these regions of SSCR 60. Regions 215 and 225 are formed by selective implantation of impurities in a manner consistent with the formation of other regions as previously described. Electrical couplings 500 make electrical contact to enhancement regions 215 and 225 through contact openings 520 and to zener diode 36 through contact openings 540. Contact openings 520 and 540 are formed in a dielectric film (not shown) deposited to overlie the IC and isolate the metallization layer, including electrical couplings 500, from underlying circuit elements, as is well known in the art. The various elements of the depicted structure are formed in a manner consistent with that of the previously described structure.

Figure 9:
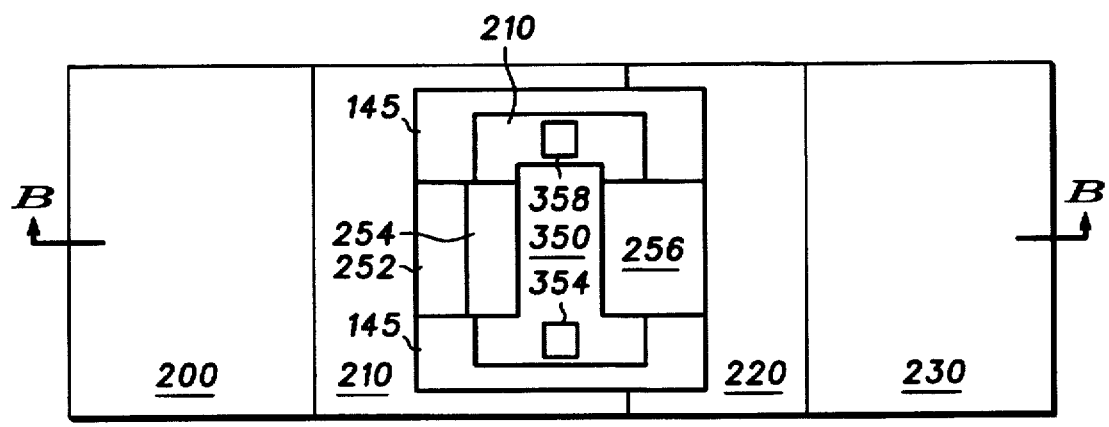
FIG. 9 is a simplified, plan view of a structure with an internal triggering device that incorporates another embodiment of the present invention.

Turning now to FIG. 9, a simplified plan view of a structure of another embodiment consistent with the present invention is shown. This structure incorporates an n-channel MOSFET as low voltage triggering apparatus 36 (FIG. 1). SSCR 30 consists of an N+ doped region 200, a P− doped region 210, an N− doped region 220, a P+ doped region 230 and a contact enhancement region 252. In this first structure, n-channel MOSFET 36 is formed within the boundaries of the four doped regions that make up SSCR 30. N-channel MOSFET 36 comprises N+ doped transistor regions 254 and 256 (source and drain regions) and polysilicon gate 350. As was seen for the zener triggered embodiment described previously, the transistor triggered embodiment is formed by a series of masked implant steps that incorporated implant steps employed for creating the other devices of the IC where possible. In addition, FIG. 9 illustrates contact region 354 for electrically coupling polysilicon gate 350 to Vss (FIG. 1) and contact region 358 to provide for a grounded gate n-channel MOSFET.

Figure 10:
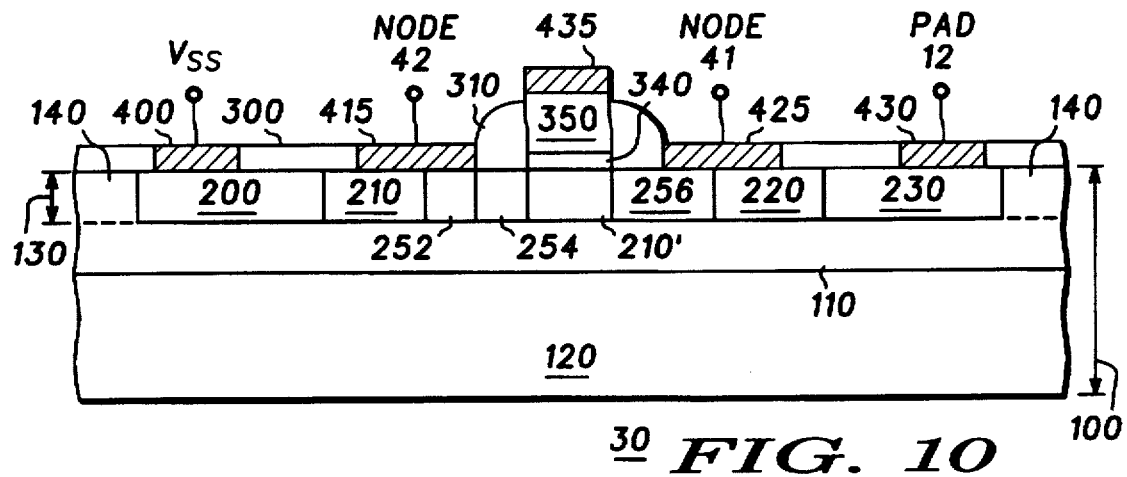
FIG. 10 through FIG. 12 are simplified, cross sectional views, taken through sectional line 9—9 of FIG. 9, of a portion of an IC during fabrication depicting various process steps in the fabrication.

In FIG. 10, a cross sectional view of the device of FIG. 9 is shown through section line 9—9. SSCR doped regions 200, 210, 220, and 230 are formed in this second embodiment in the same manner as was seen for the first embodiment in FIGS. 4 through 7. In addition, P+ doped MOSFET region 252 and N+ doped MOSFET regions 254 and 256 are also formed by implantation using photoresist as an implant mask. In particular, N+ MOSFET regions 254 and 256 form source and drain regions of n-channel MOSFET 36.

FIG. 10 also shows second P− doped region 210 underlying gate oxide layer 340 and polysilicon gate 350. Region 210 serves as a channel region of MOSFET 36. Gate oxide layer 340 and polysilicon gate 350 are formed by methods well known in the art. For example, gate oxide layer 340 can be formed by thermal oxidation and polysilicon gate 350 can be formed by low pressure chemical vapor deposition and patterning. Finally, FIG. 10 shows silicide regions 400, 415, 425, 430 and 435 interspersed by nitride layer 300 and nitride sidewall spacers 310. Silicide region 400 is electrically coupled to N+ doped SSCR region 200. Region 415 is electrically coupled to P− SSCR region 210, P+ MOSFET region 252 and N+ MOSFET region 254. Silicide region 425 is electrically coupled to N+ MOSFET region 256 and N− SSCR region 220. Silicide region 430 is electrically coupled to P+ SSCR region 230 and silicide 435 is electrically coupled to polysilicon gate 350. As seen in the discussion of the previous embodiment, all doped regions are directly over and abut buried insulation layer 110, and are adjacent to at least one other doped region. As seen in FIG. 10, SSCR region 200 is adjacent SSCR region 210 which is adjacent MOSFET region 252. MOSFET region 252 is also adjacent MOSFET region 254 which is adjacent MOSFET region 210'. MOSFET region 210' is adjacent MOSFET region 256, which is adjacent SSCR region 220. Finally it is seen that SSCR region 220 is adjacent SSCR region 230.

Figure 11:
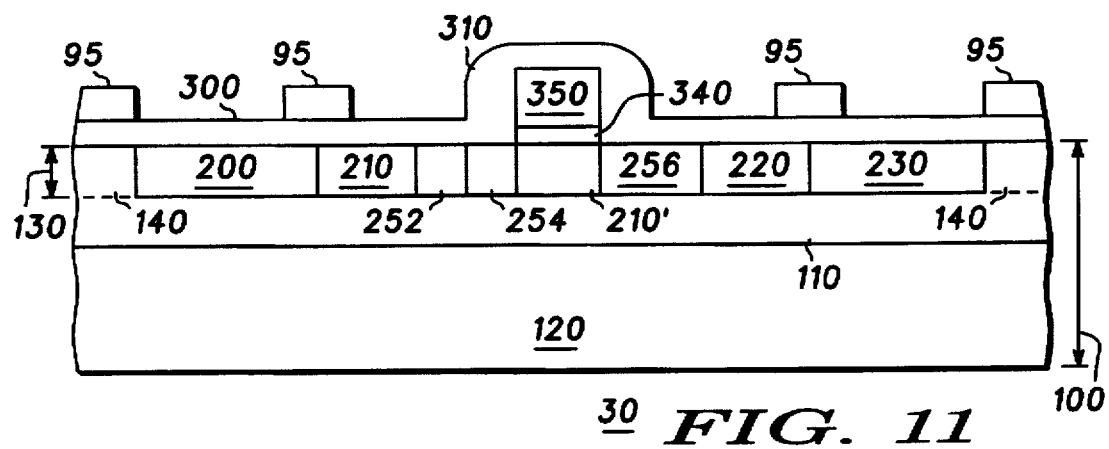
Figure 12:
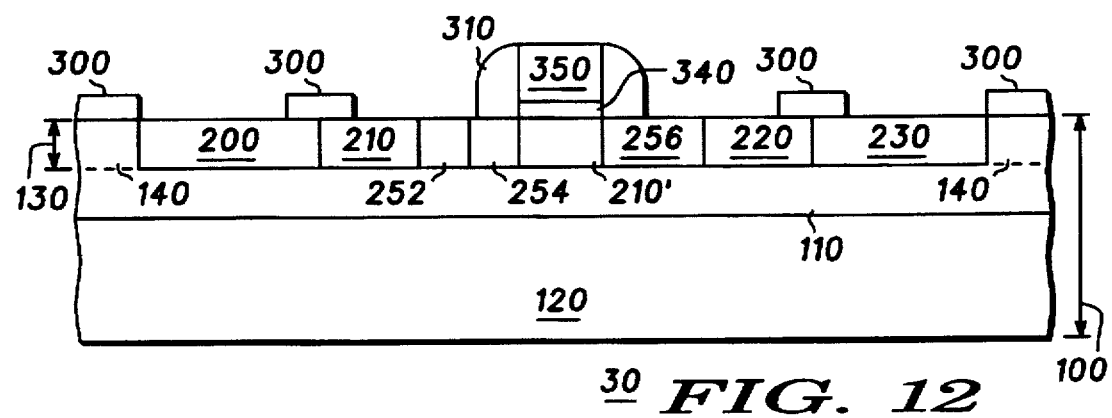

FIG. 11 and FIG. 12 illustrate the preliminary steps in the formation of silicide regions 400 through 435. In FIG. 11, substrate 100 is seen after doped regions 200 through 256 have been formed. A conformal nitride layer 300 has been deposited overlying doped regions 200 through 256 and polysilicon gate 350 forming sidewall areas 310. A photoresist layer 95 has been deposited and patterned to expose portions of nitride layer 300 to be etched. FIG. 12 illustrates the structure in FIG. 11 after nitride layer 300 has been etched and photoresist layer 95 removed. Sidewall spacers 310 have been formed adjacent to polysilicon gate 350 and will serve to mask underlying regions from forming any silicide in subsequent processing, as will remaining nitride regions 300.

Figure 13:
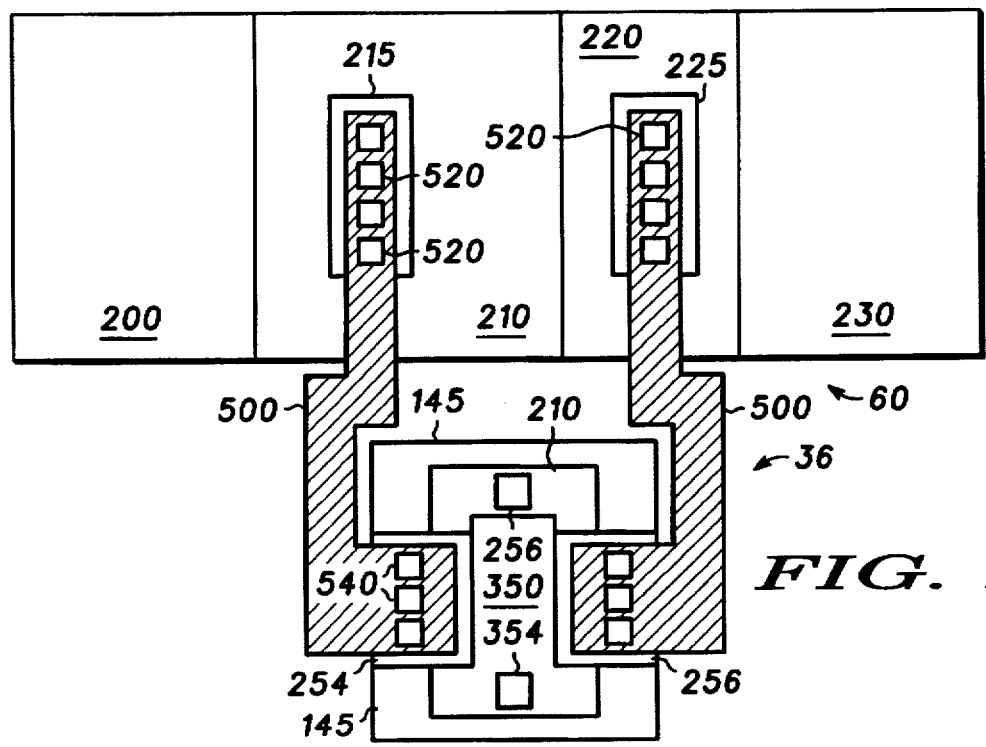
FIG. 13 is a simplified, plan view of a structure with an external triggering that incorporates another embodiment of the present invention.

In FIG. 13, another structure is shown where n-channel MOSFET 36 is formed outside the boundaries of the doped regions that make up SSCR 60. MOSFET 36 is electrically coupled to SSCR 60 by electrical couplings 500 formed from a first metallization. Contact enhancement regions 215 and 225 are formed in first P– doped region 210 and second N– doped region 220, respectively, to enhance electrical contact to these regions of SSCR 60. Regions 215 and 225 are formed by selective implantation of impurities, in a manner consistent with the formation of other regions as previously described. Electrical couplings 500 make electrical contact to these enhancement regions 215 and 225 through contact openings 520 and to MOSFET 36 through contact openings 540. Contact openings 520 and 540 are formed in a dielectric film (not shown) deposited to overlie the IC and isolate the metallization layer, including electrical couplings 500, from underlying circuit elements. The various elements of the depicted structure are formed in a manner consistent with that of the previously described structure, only the position of the doped regions are changed to reflect the structure desired.

Thus various embodiments of low voltage triggered SSCR 30 have been illustrated, as has a method for their formation. In addition, structures with an externally fabricated LVTA 36, FIGS. 8 and 13, potentially offer the advantage of fabricating transistors 32 and 33 (FIG. 1) with a higher gain than the integrated SSCR versions, FIGS. 2 and 9 respectively. Location of LVTA 36 external to the boundaries of SSCR 60 allows for SSCR doped regions 210 and 220, the base regions of transistors 33 and 32 (FIG. 1) respectively, to be narrower than when LVTA 36 is fabricated with those boundaries. In contrast, the structures with LVTA 36 fabricated within the boundaries of SSCR 60, can result in a smaller configuration, less complicated processing and simpler first metal routing.

Depicted and described herein are structures and methods for protecting integrated circuits against an ESD event. Only thin film junctions of a TFSOI device layer 130 integrated into an I/O circuit are used. In one embodiment, utilization of a zener diode with a zener breakdown voltage lower than the breakdown voltage of transistor 24 (FIG. 1) insures that SSCR 30 will trigger before an ESD event can damage critical circuit elements. As is well known, zener breakdown voltages can be controlled by dopant concentration, higher concentrations resulting in lower breakdown voltages. In another embodiment, an n-channel MOSFET 36 is formed with a gate length less than that of transistor 24 (FIG. 1) to also insure that MOSFET 36 reaches breakdown before transistor 24. Thus in each embodiment, triggering of SSCR 30 is accomplished before an ESD event can damage critical circuit elements. In addition, it has been shown how each embodiment can be formed using process steps required to form other circuit elements of the IC, thus providing an ESD protection device with minimal impact on process complexity and cost.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A thin film silicon on insulator semiconductor integrated circuit with electrostatic damage protection comprising:

a thin silicon on insulator semiconductor substrate comprising a silicon device layer overlying a buried insulation layer, comprised of silicon oxide, and wherein said buried insulation layer overlies a silicon substrate;

a plurality of integrated circuit devices formed in said silicon device layer, wherein said plurality of integrated circuit devices comprises an input/output circuit; and a surface silicon controlled rectifier formed in said silicon device layer, abutting said buried insulation layer, and electrically coupled to said input/output circuit, said surface silicon controlled rectifier comprising;

a first transistor having a control electrode, a first current carrying electrode, and a second current carrying electrode, the control electrode of the first transistor coupled to the first current carrying electrode of the first transistor;

a second transistor having a control electrode, a first current carrying electrode, and a second current carrying electrode, the control electrode of the second transistor coupled to the first current carrying electrode of the second transistor, the second current carrying electrode of the second transistor coupled to the control electrode of the first transistor and the second current carrying electrode of the first transistor coupled to the control electrode of the second transistor.

2. The thin film silicon on insulator semiconductor integrated circuit with electrostatic damage protection of claim 1, wherein said surface silicon controlled rectifier further comprises a low voltage triggering apparatus coupled between the control electrode of the first transistor and the second transistor.

3. The thin film silicon on insulator semiconductor integrated circuit with electrostatic damage protection of claim 2, wherein said low voltage triggering apparatus comprises a zener diode.

4. The thin film silicon on insulator semiconductor integrated circuit with electrostatic damage protection of claim 2, wherein said low voltage triggering apparatus comprises an n-channel MOSFET.

5. The thin film silicon on insulator semiconductor integrated circuit with electrostatic damage protection of claim 2, wherein said low voltage triggering apparatus is electrically coupled to said surface silicon controlled rectifier by a refractory metal silicide.

6. The thin film silicon on insulator semiconductor integrated circuit with electrostatic damage protection of claim 5, wherein the refractory metal silicide comprises titanium silicide.

7. The thin film silicon on insulator semiconductor integrated circuit with electrostatic damage protection of claim 2. wherein all elements of said low voltage triggering apparatus are formed within said surface silicon controlled rectifier.

8. The thin film silicon on insulator semiconductor integrated circuit with electrostatic damage protection of claim 1, wherein the first transistor is a bipolar transistor and the second transistor is a bipolar transistor.

9. A method of protecting integrated circuits formed in thin film silicon on insulator substrates from electrostatic damage, comprising:

forming a surface silicon controlled rectifier in a thin silicon device layer, the surface silicon controlled rectifier comprising:
   a first transistor having a control electrode, a first current carrying electrode, and a second current carrying electrode, the control electrode of the first transistor coupled to the first current carrying electrode of the first transistor; and
   a second transistor having a control electrode, a first current carrying electrode, and a second current carrying electrode, the control electrode of the second transistor coupled to the first current carrying electrode of the second transistor, the second current carrying electrode of the second transistor coupled to the control electrode of the first transistor and the second current carrying electrode of the first transistor coupled to the control electrode of the second transistor;

forming a low voltage triggering apparatus in said thin silicon device layer;

electrically coupling said low voltage triggering apparatus to said surface silicon controlled rectifier to form an electrostatic damage protection device; and electrically coupling said electrostatic damage protection device to an input/output circuit.

10. The method of protecting integrated circuits formed in thin film silicon on insulator substrates from electrostatic damage of claim 9, wherein the step of forming the low voltage triggering apparatus further comprises forming a zener diode.

11. The method of protecting integrated circuits formed in thin film silicon on insulator substrates from electrostatic damage of claim 10, wherein the step of forming a zener diode further comprises forming a zener diode within said surface silicon controlled rectifier.

12. The method of protecting integrated circuits formed in thin film silicon on insulator substrates from electrostatic damage of claim 9, wherein the step of forming the low voltage triggering apparatus further comprises forming an n-channel MOSFET.

13. The method of protecting integrated circuits formed in thin film silicon on insulator substrates from electrostatic damage of claim 12, wherein the step of forming an n-channel MOSFET further comprises forming an n-channel MOSFET within said surface silicon controlled rectifier.

14. The method of protecting integrated circuits formed in thin film silicon on insulator substrates from electrostatic damage of claim 9 wherein the step of electrically coupling said low voltage triggering apparatus to said surface silicon controlled rectifier further comprises forming silicide interconnects.

15. The method of protecting integrated circuits formed in thin film silicon on insulator substrates from electrostatic damage of claim 9 wherein the step of forming a surface silicon controlled rectifier in a thin silicon device layer further comprises the steps of:

forming a N+ doped surface silicon controlled rectifier (SSCR) region in a thin silicon device layer abutting a buried insulation layer;

forming a P– doped SSCR region in said thin silicon device layer abutting said buried insulation layer, wherein said P– type SSCR region is adjacent said N+ type SSCR region;

forming a N– doped SSCR region in said thin silicon device layer abutting said buried insulation layer, wherein said N– type SSCR region is adjacent said P– type SSCR region; and forming a P+ doped SSCR region in said thin silicon device layer abutting said buried insulation layer, wherein said P+ type SSCR region is adjacent said N– type SSCR region.

16. A method of forming a low voltage triggered silicon controlled rectifier on a thin film silicon on insulator substrate comprising the steps of:

forming a first transistor having a base, an emitter and a collector in a thin silicon device layer;

forming a second transistor having a base, an emitter and a collector in said thin silicon device layer, wherein said collector of said first transistor is electrically coupled to said base of said second transistor and wherein said collector of said second transistor is electrically coupled to said base of said first transistor; and forming a low voltage triggering apparatus wherein said low voltage triggering apparatus is electrically coupled to said base of said first transistor and said base of said second transistor, and wherein said low voltage triggering apparatus is self-triggering at a predictable current.

17. The method of forming a low voltage triggered silicon controlled rectifier on a thin film silicon on insulator substrate of claim 16, wherein the step of forming the low voltage triggering apparatus comprises forming a zener diode.

18. The method of forming a low voltage triggered silicon controlled rectifier on a thin film silicon on insulator substrate of claim 16, wherein the step of forming the low voltage triggering apparatus comprises forming an n-channel MOSFET.

19. The method of forming a low voltage triggered silicon controlled rectifier on a thin film silicon on insulator substrate of claim 16, wherein the step of forming the first transistor and the step of forming the second transistor comprise forming a surface silicon controlled rectifier.

20. The thin film silicon on insulator semiconductor integrated circuit with electrostatic damage protection of claim 1, wherein the control electrode of the first transistor is coupled to the second current carrying electrode of the first transistor via a first distributed resistance and the control electrode of the second transistor is coupled to the second current carrying electrode of the second transistor via a second distributed resistance.

* * * * *